United States Patent [19]

Krause

[11] Patent Number: 4,714,879
[45] Date of Patent: Dec. 22, 1987

[54] HOLDING AND TESTING DEVICE FOR ELECTRONIC MODULES WITHIN FLAT CARRIERS

[75] Inventor: Bernd Krause, Munich, Fed. Rep. of Germany

[73] Assignee: Siemens Aktiengesellschaft, Berlin and Munich, Fed. Rep. of Germany

[21] Appl. No.: 908,238

[22] Filed: Sep. 17, 1986

[30] Foreign Application Priority Data

Sep. 20, 1985 [DE] Fed. Rep. of Germany ....... 3533658

[51] Int. Cl.⁴ ..................... G01R 31/02; G01R 1/04
[52] U.S. Cl. .............................. 324/158 F; 324/158 P
[58] Field of Search ............... 324/72.5, 73 R, 73 AT, 324/73 PC, 158 P, 158 F, 158 R; 439/296

[56] References Cited

U.S. PATENT DOCUMENTS

| 3,412,333 | 11/1968 | Frick et al. ................ 324/73 AT |
| 3,560,849 | 2/1971 | Ryan ............................ 324/73 R |
| 3,678,385 | 7/1972 | Bruner . | |
| 3,715,662 | 2/1973 | Richelmann ............. 324/158 F |
| 3,761,808 | 9/1973 | Ryan . | |
| 3,968,433 | 7/1976 | Dobarganes . | |
| 4,112,363 | 9/1978 | Morrison et al. ......... 324/158 P |
| 4,329,642 | 5/1982 | Luthi et al. . | |
| 4,410,227 | 10/1983 | Prunella et al. ............ 439/296 |

FOREIGN PATENT DOCUMENTS 0515419 2/1977 U.S.S.R. ............ 324/158 F

Primary Examiner—Reinhard J. Eisenzopf
Assistant Examiner—W. Burns
Attorney, Agent, or Firm—Hill, Van Santen, Steadman & Simpson

[57] ABSTRACT

A holding and testing device for electronic modules includes a receptacle depression in a perforate plate that is held by two guide rods. A movable plate carries contact spring pins, fixing pins, and guide pins, and is mounted under the perforate plate for displacement in a vertical direction relative to the perforate plate along the guide rods. Clearances for the contact spring pins and the fixing pins are provided in the perforate plate in the region of the receptacle depression. Horizontally displaceable slides are in the perforate plate at both sides of the receptacle depression and include engagement openings for interactive engagement with the guide pins of the movable plate so that the slides are moved toward one another as the movable plate is lifted. Lateral tongue portions of the slides slide over the electronic module under test to fix the module in proper position in combination with fixing pins, and further lifting motion of the movable plate enables test contacts to make electrical connections with the electronic module under test.

19 Claims, 21 Drawing Figures

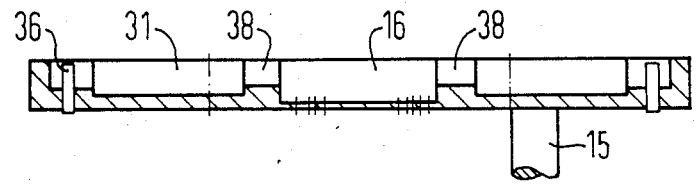
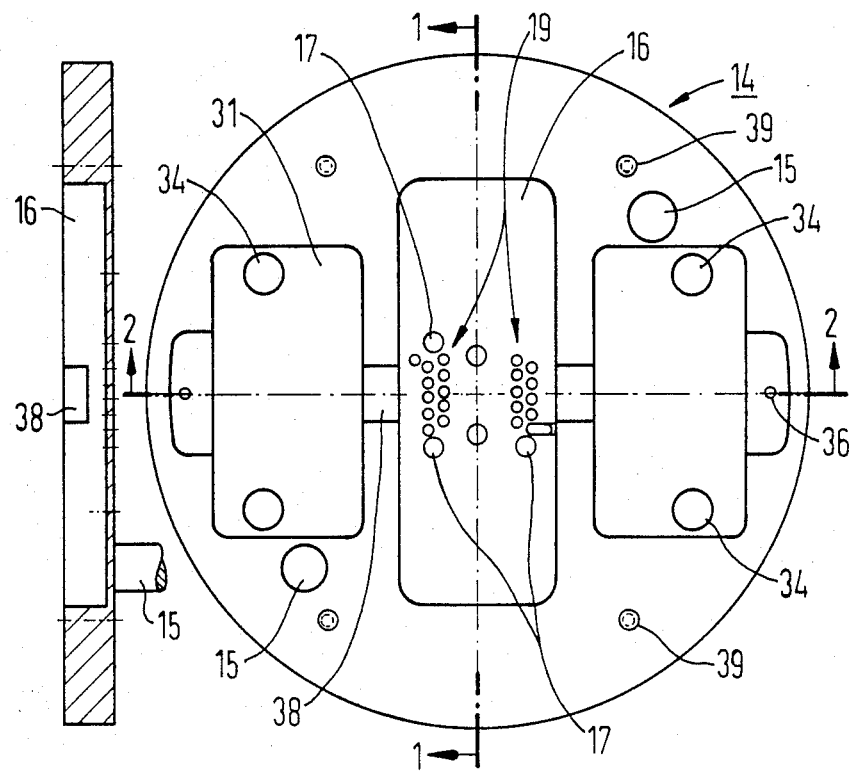

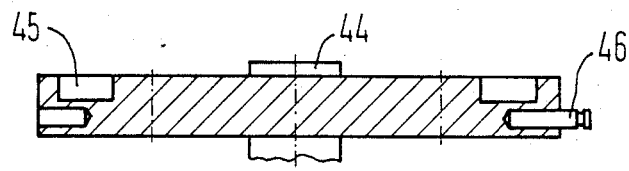
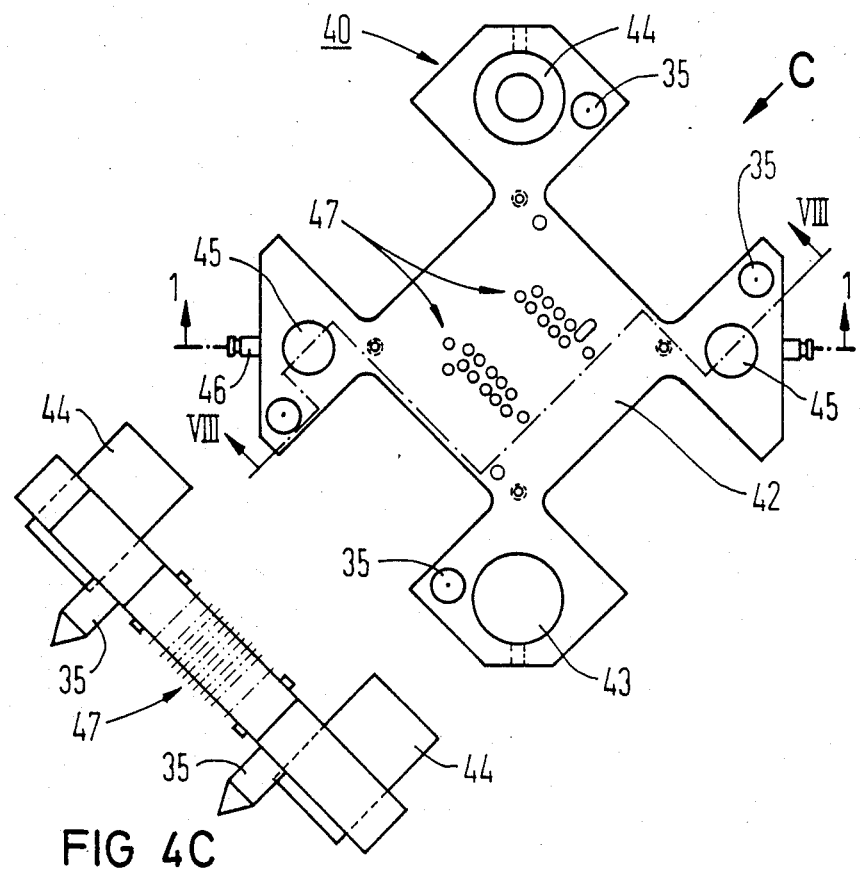

FIG 9
FIG 10
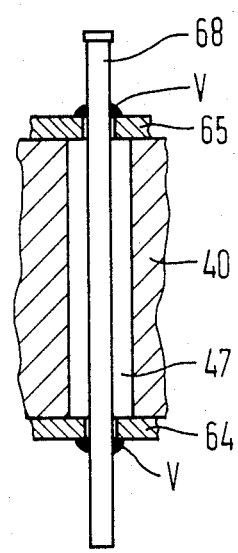
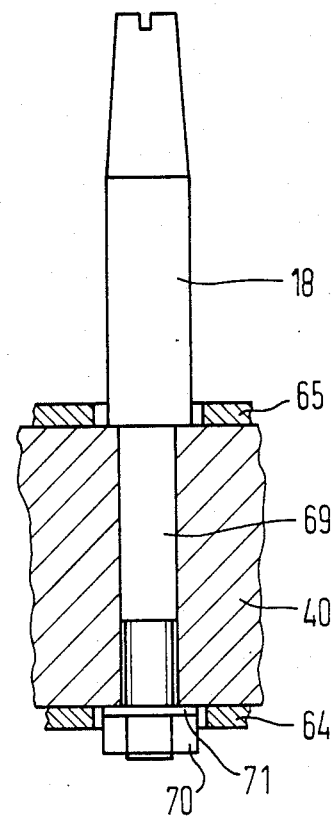

HOLDING AND TESTING DEVICE FOR ELECTRONIC MODULES WITHIN FLAT CARRIERS

BACKGROUND OF THE INVENTION

1. Field of the Invention

The present invention relates to a holding and testing device for electronic modules having terminal legs lying in a single plane.

2. Description of the Prior Art

Electronic modules, such as memory chips or circuits in integrated circuit technology and mounted in carriers, usually represent intermediate products, the serviceability of which is tested before the electronic modules are used for equipping printed circuit boards.

During testing, it is presumed that the terminal legs of the modules are held in alignment with great precision relative to a contact arrangement that has a corresponding distribution of contact pins and which is connected to a testing facility. One means for accomplishing this is by providing fixing pins in a receptacle into which the carrier is inserted, which fixing pins project into corresponding bores or indentations in the carrier and fix the carrier in horizontal alignment. The contact arrangement then is lowered from above onto the terminal legs by hand or under pneumatic control through guide rods connected to the receptacle plate so that the required test connections are made by the contact pins. The contact pins are generally connected to either a test installation or a test computer.

The known apparatus for holding and testing the electronic modules with the contact arrangements situated over the carrier are difficult to integrate into test benches. Further, since a lift is required for the contact arrangement, the known holding and testing devices do not have a compact structure. The contact arrangement lift is required so that the module carriers can be inserted into the receptacle and then later removed. Additionally, safety measures are required so that the contact arrangement is not lowered when the operator's fingers are between the module holder and the contact arrangement.

SUMMARY OF THE PRESENT INVENTION

It is an object of the present invention to provide a compact and simple holding and testing device for electronic modules which is freely accessible from one direction without impediment by a contact arrangement.

Another object of the present invention is to provide a holding and testing device which is easily mounted into a planar test bench and/or is attachable to multiple coaxial plugs.

These and other objects of the present invention are provided in a holding and testing arrangement for electronic module carriers having a movable plate with a spring contact arrangement that is moved from below against a perforate plate provided with a receptacle depression for the module carrier. Fixing pins for horizontally fixing the carrier are secured to the movable plate next to the contact arrangement in the same parallel alignment. The fixing pins, like the contact pins, are freely movable in the axial direction within and projecting through corresponding bores of the perforate plate.

Guide pins are also secured in the movable plate in the same parallel alignment as the fixing pins and contact pins, and are freely movable in the axial direction in other bores of the perforate plate. The guide pins have conical tips which engage into bores formed in horizontally displaceable slides which are slidably mounted in the perforate plate. Each slide includes a tongue extending in the direction of the module carrier. The tongues slide laterally over the carrier leads into a depression between the fixing pins upon vertical movement of the guide pins, thereby fixing the carrier in correct position in combination with the fixing pins. Fixing of the carrier is completed before a further upward movement of the movable plate takes place to enable the contact pins to connect to the terminal legs of the electronic module within the inserted carrier.

As the result of the movement of a single adjustment member, which in this case is the movable plate having the fixing and guide pins, the module carrier is positionally fixed in a particularly simple way. The displacement of the movable plate relative to the perforate plate is kept relatively small since all movable parts are found on that side of the perforate plate facing away from the operator accessible side. The operator side is, thus, freely accessible as a receptacle for the module carriers to be tested. This enables the additional safety measures required in the prior art devices for protecting the operator to be eliminated.

Further developments of the present invention relating to the formation of the perforate plate, the movable plate having an adjustment mechanism for displacement relative to the perforate plate, and other construction details are set forth hereinafter in conjunction with references to the Figures.

BRIEF DESCRIPTION OF THE DRAWINGS

FIG. 3A is a plan view of a perforate plate from the holding and testing device of the present invention;

FIG. 3B is a cross-section along lines 1—1 of the perforate plate of FIG. 3A;

FIG. 3C is a cross-section along lines 2—2 of the perforate plate of FIG. 3A;

FIG. 4A is plan view of a movable plate from the holding and testing device of the present invention;

FIG. 4B is a cross-section along lines 1—1 of the movable plate of FIG. 4A;

FIG. 4C is a side view in the direction of the arrow C of the movable plate shown in FIG. 4A;

FIG. 9 is a magnified cross-section of a spring contact pin of the present invention; and FIG. 10 is a magnified cross-section of a fixing pin of the present invention.

DESCRIPTION OF THE PREFERRED EMBODIMENTS

Figure 1B:
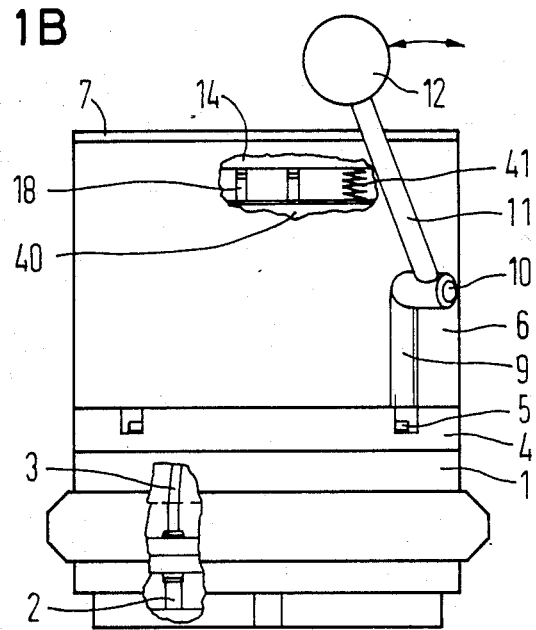
FIG. 1B is a side elevational view of the holding and testing device shown in FIG. 1A in the direction of the arrow B and partially broken away.
Figure 1A:
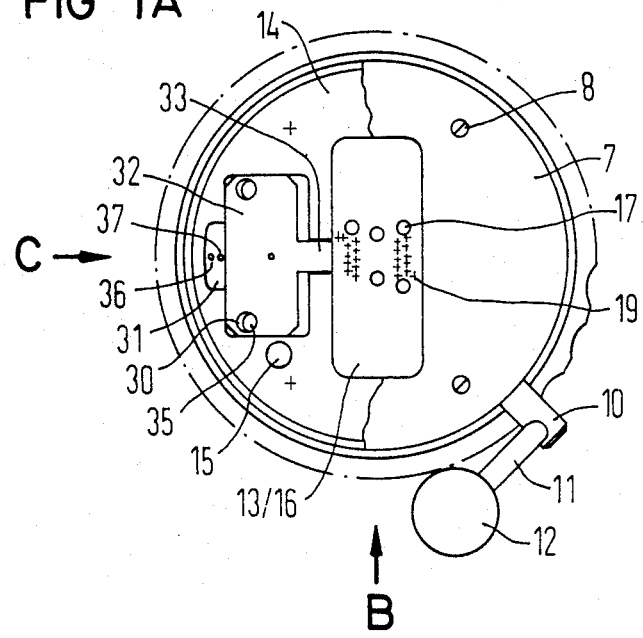
FIG. 1A is a plan view of a holding and testing device in accordance with the principles of the present invention, partially broken away at a cover plate.
Figure 1C:
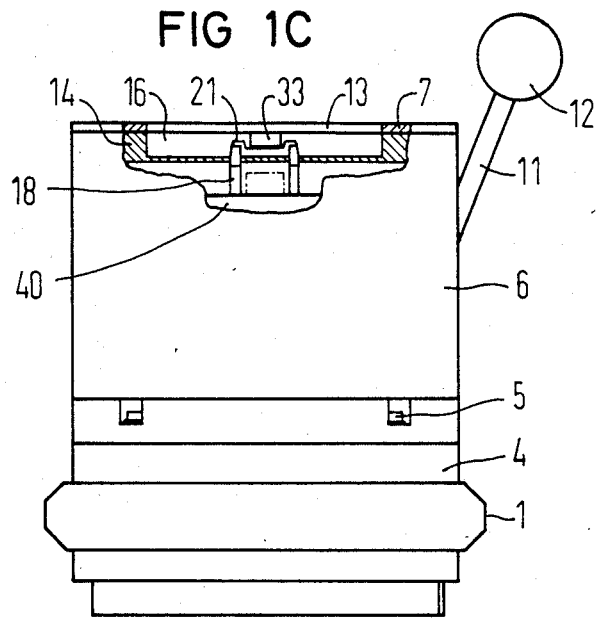
FIG. 1C is a side elevational view of the holding and testing device of FIG. 1A in the direction of arrow C, partially broken away.

Referring first to FIGS. 1A, 1B, and 1C, an exemplary embodiment of an independent holding and testing device is shown mounted on a commercially available multiple coaxial connecting plug portion 1. The coaxial connecting plug portion 1, for example, includes sixty-four plug sockets which are connectable to a test installation, or to a test computer, through coaxial lines, as is known. In FIG. 1B, plug sockets 2 are connected to individual spring contacts (not shown in FIG. 1) of a spring contact arrangement mounted within the holding and testing device. The spring contact arrangement is connected to the plug sockets 2 by connecting lines 3. A carrier ring 4 is secured to the multiple coaxial connecting plug portion 1 by, for example, four screws 5 that are uniformly distributed about the carrier ring 4. A housing sleeve 6 is mounted thereon and has its open end enclosed by a cover plate 7. The cover plate 7 is secured by screws 8 to a perforate plate 14 lying therebelow which, in turn, is held by the carrier ring 4.

As shown in FIG. 1B, a slot 9 is provided in the housing sleeve 6 to accept an outwardly projecting adjustment shaft 10, the housing sleeve 6 having been slipped thereon. The adjustment shaft 10 includes a lever 11 and a knob 12 secured thereto and is rotatable by movement of the lever 11 back and forth in the direction of the arrow between two latched positions. The present holding and testing device is operated by movement of the lever 11.

In FIGS. 1A and 1C, a rectangular recess 13 is provided in the cover plate 7 with a corresponding depression 16 provided in the perforate plate 14 lying therebelow. The recess 13 and the depression 16 forms a receptacle for a carrier 21 of an electronic module to be tested, such as an integrated circuit chip package. The carrier 21 is fixed in horizontal alignment in the receptacle opening trough 13 and 16 by fixing pins 18, each of which is conically tapered at its free end. The free ends of the fixing pins 18 project through bores 17 in the perforate plate 14. The perforate plate 14 includes, in addition to the bores 17, further bores 19 which are arranged in accordance with individual terminal legs of the electronic module to be tested. Contact pins of the spring contact arrangement are freely movable through the further bores 19 to make the desired electrical connections with the electronic module to be tested.

Figure 2B:
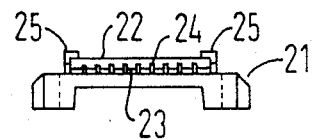
FIG. 2B is a side elevational view of the module carrier shown in FIG. 2A.
Figure 2A:
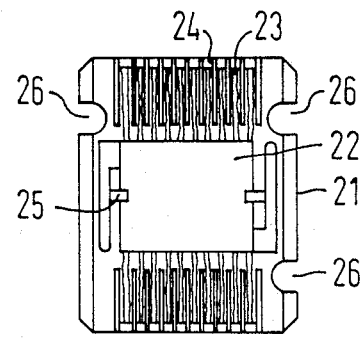
FIG. 2A is a plan view of a module carrier for use with the holding and testing device of FIG. 1.

In FIGS. 2A and 2B, the carrier member 21 is shown within which is mounted an electronic module 22. The module 22 is held in the carrier 21 by retaining clips 25, and terminal legs 23 which extend from both sides of the module 22 in the same plane are disposed between webs 24 formed in the carrier 21. Indentations 26 are also provided in the carrier 21 along the sides thereof for positionally fixing the carrier 21.

Referring again to FIG. 1C, the carrier 21 in which the module 22 is mounted is inserted upside down into the receptacle trough 13 and 16 so that the ends of the fixing pins 18 engage the lateral indentations 26. Two opposing slides 32 lying opposite one another are provided in lateral depressions 31 in the perforate plate 14 to prevent the carrier 21 from being vertically displaced from the perforate plate 14 as the contact pins are put in place on the terminal legs 23 of the module 22. The slides 32 are horizontally displaceable toward one another within the depressions 31 in the direction of the receptacle trough 13 and 16. The slides 32 include tongue portions 33 extending in the direction of the receptacle trough 13 and 16 which slide over the back surface of the carrier 21 when the slides 32 are displaced and thereby fix the carrier 21 in the vertical direction.

The slides 32 embedded in the perforate plate 14 are displaced with the assistance of bores 30, as shown in FIG. 1A, into which the conical tips of the guide pins 35 project. In the initial latched position, the conical tips of the guide pins 35 lie against the inside edge of the bores 30 in the direction of the receptacle trough 13 and 16. When the guide pins 35 are lifted, the bevel of the conical ends, in combination with the cover plate 7, effects a lateral movement of the slides 32. The lateral movement continues until the guide pins 35 have reached a concentric position relative to the bores 30 in the slides 32. Thereafter, the guide pins 35 continue to slide in the bores 30 without additional lateral displacement of the slides 32. When the displacement of the guide pins 35 is coupled with the movement of the contact pins of the contact arrangement that make the electrical connections to the terminal legs 23 of the module 22, then the contact pins do not touch the terminal legs 23 until the position of the carrier 22 has been fixed in the receptacle trough 13 and 16. Thus, the carrier 22 is fixed securely in the receptacle trough 13 and 16 in a particularly simple way by the tongue portions 33 of the slides 32 and by the fixing pins 18.

Also, as shown in FIG. 1A, a peg 36 to which a tension spring 37 is connected is within a lateral bulge formed in the depression 31 for each of the slides 32. The tension spring 37 is attached to a portion of the slide 32 lying opposite the tongue portion 33. Thus, the tension spring 37 moves the slide 32 laterally outward as the guide pins 35 are moved to their initial position, causing the slide 32 to release the carrier 21.

In FIGS. 3A, 3B, and 3C, the perforate plate 14 is shown disembodied from the holding and testing device of FIGS. 1A, 1B, and 1C. The individual depressions formed in the perforate plate 14 are of differing depths. This is particularly true for a recessed region 38 for accepting the tongue portions 33 of the slides 32, as well as for the region which includes the retaining peg 36 for the tension spring 37. The different heights of the depressed regions 16, 38, and 31 are a result of matching the underside of the tongue portion 33 to the height of the carrier 21 over which the tongue 33 is moved. Further, the dimensions of the different depressions 16, 38, and 31 are such that, when the guide pins 35, with their beveled surfaces for effecting lateral displacements of the slides 32, are in the upper final position, the guide pins 35 do not project too far above the upper edge of the perforate plate 14. On the other hand, an adequate lift of the contact spring arrangement is required after the final position of the slides 32 have been reached. A more pronounced depression 31 for the slides 32, as compared to the region for the retaining peg 36, provides a natural stop edge for the idle position of the slide 32. This is particularly true when an embodiment other than that shown includes slides having the same width as the tongue portions and when a single guide pin is provided for each slide.

Also with reference to FIGS. 3A, 3B, and 3C, the perforate plate 14 is mounted on two cylindrical rods 15 disposed diagonally opposite one another. The rods 15 are rigidly connected to the perforate plate 14 such as, for example, by a press fit. The rods 15 have their opposite ends set into the carrier ring 4 (of FIG. 1B) so that there is a rigid connection between the perforate plate 14 and the carrier ring 4 is formed.

The two rods 15 simultaneously form guide rods for the movable plate 40 which is shown in FIGS. 4A, 4B, and 4C. The movable plate 40 includes a central quadratic plate portion 42 having enlarged portions adjacent each of the individual corners. Linear bearings 44 are mounted in bores 43 that extend through a pair of diagonally opposite ones of the enlarged portions. The linear bearings 44 enable the movable plate 40 to be moved along the rods 15 shown in FIG. 3, the rods 15 serving as guide rods.

The other ones of the enlarged portions, in contrast thereto, are provided with circular depressions 45 for accepting dumping springs 41, which are shown in FIG. 1B. The damping springs 41 cushion movement of the movable plate 40 relative to the perforate plate 14. Lateral pegs 46 are also provided extending from the other ones of the enlarged portions, the movement of the movable plate 40 along the guide rods 15 being produced with the aid of the pegs 46. Additionally, one of the four guide pins 35 is secured at each of the enlarged portions.

The movable plate 40 includes bores 47 in the central quadratic portion in which are mounted the individual contact pins and the fixing pins 18. The bores 47 are in concentric alignment with the bores 17 of the perforate plate 14 shown in FIG. 3A.

FIG. 4B shows the receptacle depressions 45 for the damping springs, as well as the pegs 46 for connection to a lifting means. In FIG. 4C, the conical tapering of the guide pins 35 is clearly shown, as well as the linear bearings 44.

Figure 5C:
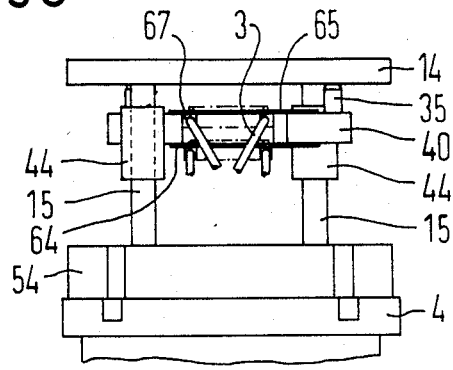
FIG. 5C is a side elevational view in the direction of the arrow C of FIG. 5A for comparison to FIG. 5B.
Figure 5B:
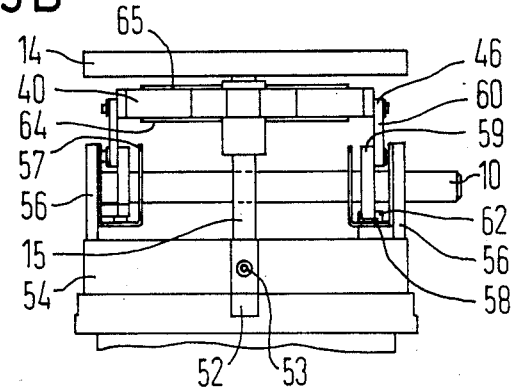
FIG. 5B is a side elevational view of the arrangement of FIG. 5A, including a movable plate and a perforate plate.
Figure 5A:
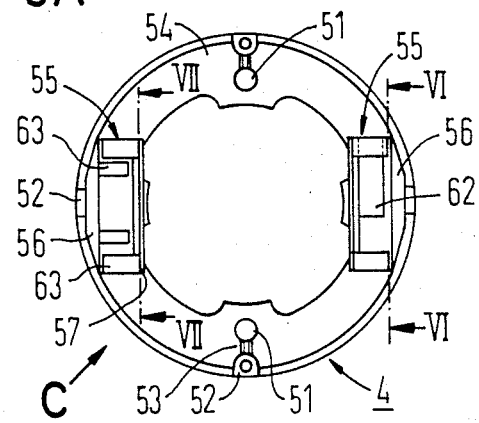
FIG. 5A is a plan view of a carrying ring with bearings for an adjustment shaft of a holding and testing device as shown in FIGS. 1B and 1C.

With reference to FIGS. 5A, 5B, and 5C, the movable plate 40 is movable in a vertical direction up and down along the guide rods 15, the guide rods 15 extending between the carrier ring 4 and the perforate plate 14. The movable plate 40 is moved by a lifting gear driven by the shaft 10. In FIG. 5A, the layout of the carrier ring 4 includes two bearings 55 secured thereto for the shaft 10 (not shown in FIG. 5A). The carrier ring 4 also includes acceptance bores 51 for the two guide rods 15 and indentations 52 at the edge thereof which have bores for fastening to the plug portion 1 by the screws 5.

As seen in FIG. 5B, the guide rods 15 are held by grub screws in threaded bores 53. Two bearings 55 for the shaft 10 are applied within a shoulder 54 formed on the carrier ring 4, over which the housing sleeves 6 of FIG. 1B is fitted. Each of the bearings 55 includes an outer bearing block 56 and an upwardly slotted angle 57 into which the shaft 10 is inserted, these being secured to the carrier ring 4 by screws 58. Cams 59 are rigidly attached to both ends of the shaft 10 and are each connected to the movable plate 40 by a guide rod, or link, 60. The links 60 is hingedly affixed at each respective end to the movable plate 40 and the cam 59, respectively. Thus, rotational movement of the shaft 10 is converted into a dislocation of the movable plate 40 along the guide rods 15.

Figures 6A, 6B:
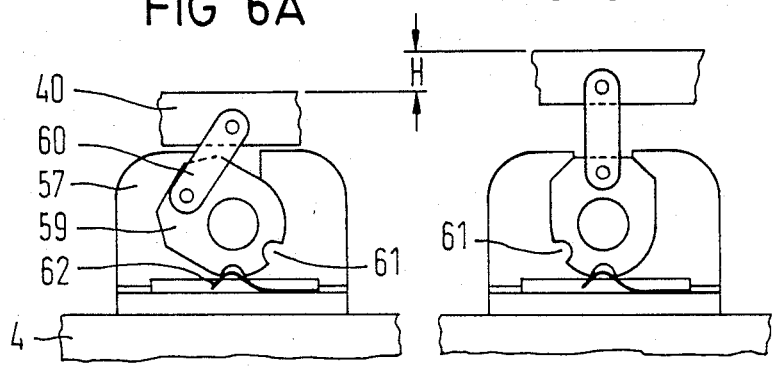
FIG. 6A is an enlarged cross-section along lines VI—VI of FIG. 5A showing one bearing in a first latched position.
FIG. 6B is an enlarged cross-section of the bearing shown in FIG. 6A showing a second possible latched position.

Further details on the dislocation of the movable plate 40 as effected by the cams 59 can be seen in FIGS. 6 and 7. FIGS. 6A and 6B show the right-hand bearing denoted generally 55 in FIG. 5A. The cam 59 includes two latch indentations 61 at each lower edge. A spring 62 is correspondingly formed to engage the indentations 61 in latching fashion at two positions. As the cam 59 is moved from a first latch position to a second latch position, the movable plate 40 moves vertically along the rods 15 by a distance H.

Figures 7A, 7B:
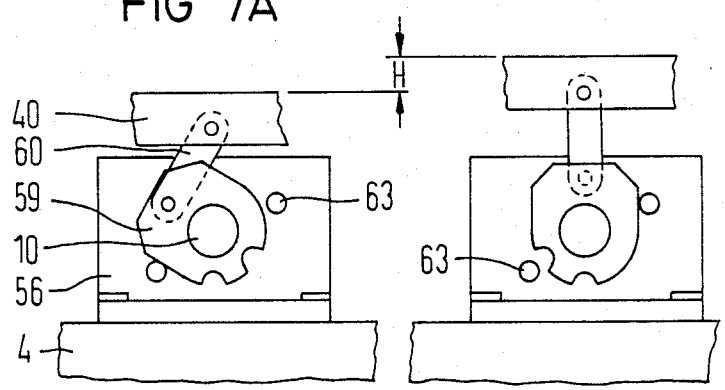
FIG. 7A is an enlarged cross-section along lines VII—VII of FIG. 5A showing another bearing.
FIG. 7B shows the bearing of FIG. 7A in a second position.

In similar fashion, FIGS. 7A and 7B show the left-hand bearing denoted generally at 55 in FIG. 5A. A pair of stop pegs 63, mounted to engage the two lateral edges of the cam 59, limits rotational movement of the shaft 10. Departing from the illustrated embodiment, the spring 62 for marking the latched positions and the stop pegs 63 for limiting the rotational movement can each be provided at both bearings 55.

With reference now to FIG. 5C, the apparatus of FIG. 5A is shown from the direction of arrow C with the bearings 55 omitted. The view of FIG. 5C, thus, corresponds to the sectional view of the perforate plate 14 of FIG. 3B and illustrates the electrical connecting lines 3 of FIG. 1B. In FIGS. 5B and 5C, a printed circuit board 64 and 65, respectively, is provided both at the underside as well as at the upperside of the movable plate 40. The printed circuit boards 64 and 65 cover the central quadratic plate portion 42 of the movable plate 40 and project past the plate portion 42 along the sides between the enlarged portions adjacent the corners. In the region of the central quadratic portion 42, the printed circuit boards 64 and 65 include bores concentrically aligning with the bores 47. Sleeves 68, shown in greater detail in FIG. 9, for the spring contacts 10 are soldered into the bores in the printed circuit board 64 and 65 at both sides.

In FIG. 9, solder locations V connect the spring contact pins to printed circuit interconnects which extend to contact bores at the projecting edge region of the two printed circuit boards 64 and 65, into which coaxial cable junctions for the connecting lines 3 are soldered. As shown in FIG. 10, larger bore holes are provided in the printed circuit boards 64 and 65 concentric with the fixing pins 18 that are fastened to the movable plate 40. The fixing pins 18 have a shoulder 69 inserted into the corresponding bore in the plate 40 and are free of the printed circuit boards 64 and 65. At a free end, the shoulder 69 is threaded and the fixing pin 18 is held by a washer 71 and a nut 70.

Figure 8:
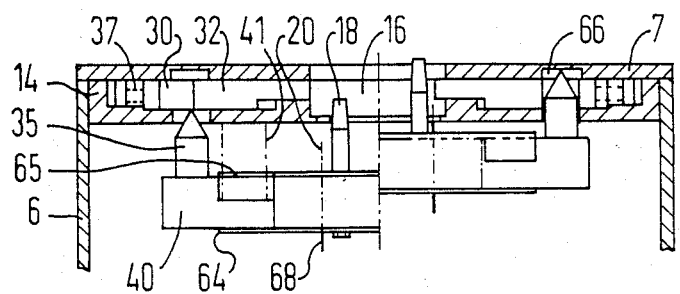
FIG. 8 is a cross-section along lines VIII—VIII of FIG. 4A and a cross-section of the perforate plate of FIG. 3C showing the relative functioning of each.

FIG. 8 shows the upper portion of the testing and holding device, bisected to show the movable plate 40 in two possible lift positions. The movable plate 40 includes fixing pins 18, the spring contact pins 20 and the guide pins 35. The left side of FIG. 8 shows an initial latched position while on the right side of FIG. 8 is illustrated the latched test position. In the initial latched position, the slides 32 are drawn outwardly by the tension spring 37 until detent, so that the tongue portions 33 do not project into the depression 16, which is the receptacle for the module under test. Only the fixing pins 18 extend through the perforate plate 14 and project into the depression 16. The module under test is inserted onto the fixing pins 18 for alignment. The tips of the guide pins 35 project only slightly into the bores 30 of the slides 32 in the region of the bore edge facing the tongue portion 33. When the movable plate 40 is moved upward from the initial latched position, the conical tip of the guide pins 35 acts as a wedge to press the slide 32 toward the side, since the cover plate 7 prevents upward motion thereof. As a consequence of the lateral thrusting effect, the slide 32 moves in the direction toward the receptacle depression 16 to cause the tongue 33 to slide over the carrier back of the module under test.

The fixing pins 18 which extend parallel to the guide pins 35 are also upwardly displaced. When the conical tips of the guide pins 35 have been fully introduced into the bores 30 of the slides 32, the slide 32 is in its final position. A further lifting motion of the movable plate 40 and the guide pins 35 does not result in a further lateral dislocation of the slides 32. The residual upward lifting motion from this point until the latched test position is reached causes the contacting pins 20, also secured to the movable plate 40, to be placed onto the terminal legs of the module under test. This occurs after the module under test is fixed by the fixing pins 18 in combination with the tongues 33 of the slides 32.

Thus, a compact holding and testing device which is extremely easy to use and can be employed in many ways is provided.

Departing from the illustrated embodiment, the device need not be an independent device with manual actuation but can in fact be inserted into test benches, where, for example, the carrier ring is provided with additional catch pieces or with a retaining flange to secure the unit to the test bench plate from below or above. The device can also be built into the test desk without further ado by providing the perforate plate with additional retaining catches or with a retaining flange for fastening to the test desk. Further, a portion of the test desk, or bench, may be used as the cover plate over the perforate plate, so that the recess 13 is formed directly in the top of the test bench, thereby providing an uncluttered test bench. For such arrangement, actuation of the adjustment shaft 10 may be by pneumatically functioning adjustment means.

A number of possible variations on the structural format of the present testing and holding device is possible. Such variations can apply to the design of the slides and their motion control by one or two guide pins, as well as to the interactive engagement between the guide pins and the slides for converting the axial longitudinal displacement of the guide pins into movement of the slides perpendicular thereto. For instance, subdivision into two motion phases is possible, whereby a lateral displacement of the slides is only possible during the first phase. Similar design changes can be applied for the lifting gear for converting rotational movement into vertical displacement of the movable plate.

On the other hand, the arrangement of the fixing pins and of the contact spring pins is predominantly determined by the various units under test. Insofar as no superimposition possibilities exist for this because the fixing pins are to be differently allocated or because the configuration grid underlying the contact spring arrangement need not be congruently aligned, appropriately modified holding and testing devices are to be provided. Interchange of such grid configurations is facilitated by the uniform multiple coaxial connecting plug which connects to a test installation.

Although modifications and changes may be suggested by those skilled in the art, it is the intention of the inventor to embody within the patent warranted hereon all changes and modifications as reasonably and properly come within the scope of his contribution to the art.

I claim as my invention:

1. A holding and testing device for electronic modules having terminal legs lying in a single plane for connection to a test installation, the electronic modules being mounted in flat carriers having openings for positional fixing, comprising:

a movable plate;
   an arrangement of spring contacts on said movable plate for conductive connection between individual terminal legs of a module and the test installation;
   fixing pins extending from said movable plate for engagement with said openings in said flat carriers;
   guide pins having beveled free ends and extending from said movable plate parallel to and in the same direction as said arrangement of spring contacts;
   a perforate plate including a receptacle formed as a trough for said flat carrier, said perforate plate being above said movable plate and including clearances corresponding to individual ones of said spring contacts and to said fixing pins and to said guide pins;
   said spring contact arrangement being displaceable relative to said receptacle;
   said fixing pin in an initial latched position having free ends projecting through said clearances in said perforate plate and engaging said openings of said flat carrier in said receptacle trough;
   first and second horizontally displaceable slides in said perforate plate and including at least one engagement opening in each slide for said guide pins;
   each of said guide pins having a tip lying against the edge of a respective one of said engagement openings when in an initial latched position so that said first and second slides are horizontally movable toward one another upon vertical displacement of said guide pins;
   laterally extending tongues affixed to said first and second slides and extending over said flat carrier when said slides are horizontally displaced to fix the electronic module in position in combination with said fixing pins; and
   said movable plate being movable into a latched test position wherein said spring contacts produce electrical connections to individual terminal legs of the electronic module.

2. A holding and testing device as claimed in claim 1, wherein said movable plate includes a central quadratic plate portion having horizontally extending enlargements at its four corners, two of said enlargements diagonally opposite one another being provided with bores, further comprising:

linear bearings inserted into said bores in said two enlargements;
   guide rods on which said linear bearings are mounted for vertical displacement of said movable plate therealong;
   a drive means for displacement of said movable plate; and connecting elements coupled to another two of said enlargements of said movable plate lying opposite one another for movement by said drive means.

3. A holding and testing device as claimed in claim 2, wherein said drive means includes:
   a horizontally seated shaft;
   first and second cams connected to said movable plate and mounted on said shaft; and
   guide rods connecting each of said first and second cams to said movable plate so that said movable plate is vertically displaceable along said guide rods by turning said shaft.

4. A holding and testing device as claimed in claim 3, further comprising:
   two bearings rotationally mounting said shaft; and
   two stop pegs provided on at least one of said two bearings for limiting the rotational movement of a respective one of said cams and for limiting lifting movement of said movable plate.

5. A holding and testing device as claimed in claim 4, wherein at least one of said two cams includes first and second indentations at the edge of said at least one cam; and further comprising:
   a spring having an arced portion alternately engaging said first and second indentations in latching fashion to limit the rotational movement of said shaft for defining an initial latched position and a latched test position.

6. A holding and testing device as claimed in claim 3, wherein said guide rods are rigidly connected at a first end to said perforate plate, and further comprising:
   a common carrier element secured to second opposite ends of said guide rods and secured to said bearings for said shaft so that said holding and testing device forms a uniform structural part.

7. A holding and testing device as claimed in claim 6, wherein said common carrier element is formed as an adapter ring for connection to a multiple coaxial connecting plug portion by which a connection to a test installation is made.

8. A holding and testing device as claimed in claim 6, wherein said perforate plate is formed as an insert for a test bench.

9. A holding and testing device as claimed in claim 6, wherein said perforate plate is secured to a portion of a test bench forming a cover plate.

10. A holding and testing device as claimed in claim 7, wherein said adapter ring is fastenable to a test bench, and said uniform structural part carried by said adapter ring rises above the surface of said test bench.

11. A holding and testing device as claimed in claim 6, further comprising: a hand lever attached to said shaft for manual actuation.

12. A holding and testing device as claimed in claim 11, further comprising:
   a housing sleeve placed over said uniform structural part from the direction of said perforate plate;
   said perforate plate having a circular shape, and being held by an adapter ring;
   a cover plate for holding said adapter ring and for covering said housing sleeve.

13. A holding and testing device as claimed in claim 8, further comprising: pneumatically operated adjustment means connected to said shaft for driving said movable plate.

14. A holding and testing device as claimed in claim 1, further comprising:
   a first printed circuit board secured above said movable plate;
   a second printed circuit board secured below said movable plate;
   said first and second printed circuit boards including holes in concentric alignment with ones of said spring contacts; and
   sleeves for said spring contacts penetrating said bores and being soldered into said bores.

15. A holding and testing device as claimed in claim 14, wherein said first and second printed boards project beyond a central quadratic plate portion in regions between enlargements at the corners of said movable plate; further comprising:
   coaxial cable junctions soldered into bores in said first and second printed circuit boards and connected to said contacts by interconnects on said first and second printed circuit boards, and
   said coaxial cable junctions being soldered in coverage-free regions of said printed circuit boards characterized by an absence of spring contacts.

16. A holding and testing device as claimed in claim 1, wherein
   said first and second slides have substantially the same width as said laterally extending tongues, and
   said slides being mounted for interactive engagement with said guide pins.

17. A holding and testing device as claimed in claim 1, wherein said slides have a significantly greater width than said tongues, and said slides being mounted for interactive engagement with two of said guide pins.

18. A holding and testing device as claimed in claim 16, wherein said engagement openings of said slides are structurally adapted to said beveled ends of said guide pins so that during a first motion phase of the movable plate said guide pins exert a force on said slides to affect a horizontal displacement and so that during a second motion phase of said movable plate a further vertical motion of said pins does not effect displacement of said slides; and further comprising:
   a tension spring connected to each of said slides for returning said slides to an initial position.

19. A holding and testing device as claimed in claim 18, wherein
   said engagement openings of said slides are formed as bore holes having a circular cross-section; and
   said guide pins have a cross-section adapted to the cross-section of said bore holes and having a conically tapered free end.

* * * * *